United States Patent
Asano et al.

(10) Patent No.: US 10,704,137 B2
(45) Date of Patent: Jul. 7, 2020

(54) MASTER ALLOY FOR SPUTTERING TARGET AND METHOD FOR PRODUCING SPUTTERING TARGET

(71) Applicant: JX Nippon Mining & Metals Corporation, Tokyo (JP)

(72) Inventors: Takayuki Asano, Ibaraki (JP); Kunihiro Oda, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 450 days.

(21) Appl. No.: 15/515,457

(22) PCT Filed: Sep. 28, 2015

(86) PCT No.: PCT/JP2015/077249
§ 371 (c)(1),
(2) Date: Mar. 29, 2017

(87) PCT Pub. No.: WO2016/052371
PCT Pub. Date: Apr. 7, 2016

(65) Prior Publication Data
US 2017/0218502 A1    Aug. 3, 2017

(30) Foreign Application Priority Data

Sep. 30, 2014  (JP) .................. 2014-201063

(51) Int. Cl.
| | | |
|---|---|---|
| C23C 14/34 | (2006.01) | |
| C22C 27/00 | (2006.01) | |
| C22C 27/02 | (2006.01) | |
| C22C 27/04 | (2006.01) | |
| C22C 27/06 | (2006.01) | |
| C22C 14/00 | (2006.01) | |
| C22C 22/00 | (2006.01) | |
| C22C 19/07 | (2006.01) | |
| C22C 5/04 | (2006.01) | |
| C22C 19/03 | (2006.01) | |
| C22C 1/04 | (2006.01) | |
| H01J 37/34 | (2006.01) | |
| C23C 14/16 | (2006.01) | |

(52) U.S. Cl.
CPC .......... *C23C 14/3414* (2013.01); *C22C 1/045* (2013.01); *C22C 5/04* (2013.01); *C22C 14/00* (2013.01); *C22C 19/03* (2013.01); *C22C 19/07* (2013.01); *C22C 22/00* (2013.01); *C22C 27/00* (2013.01); *C22C 27/02* (2013.01); *C22C 27/04* (2013.01); *C22C 27/06* (2013.01); *C23C 14/165* (2013.01); *H01J 37/3426* (2013.01)

(58) Field of Classification Search
CPC .................... C23C 14/3414; H01J 37/3426
See application file for complete search history.

(56) References Cited

U.S. PATENT DOCUMENTS

| | | | |
|---|---|---|---|
| 4,957,549 A * | 9/1990 | Matsumoto | C22C 1/0441 148/301 |
| 5,082,433 A * | 1/1992 | Leithner | C22C 33/0257 419/11 |
| 6,165,607 A | 12/2000 | Yamanobe et al. | |
| 7,871,564 B2 | 1/2011 | Kanou et al. | |
| 8,425,696 B2 | 4/2013 | Oda et al. | |
| 8,430,978 B2 | 4/2013 | Inoue et al. | |
| 2004/0062675 A1 * | 4/2004 | Zhang | B22F 3/16 419/49 |
| 2004/0101781 A1 | 5/2004 | Oda et al. | |
| 2004/0103750 A1 * | 6/2004 | Nakamura | C22C 5/02 75/10.14 |
| 2008/0173543 A1 | 7/2008 | Ziani | |
| 2009/0114535 A1 | 5/2009 | Oda | |
| 2013/0206592 A1 | 8/2013 | Arakawa et al. | |
| 2015/0129422 A1 | 5/2015 | Harada | |

FOREIGN PATENT DOCUMENTS

| | | | |
|---|---|---|---|
| JP | 03047951 A | * | 2/1991 |
| JP | H05-065629 A | | 3/1993 |
| JP | 2000-207725 A | | 7/2000 |
| JP | 2003-064473 A | | 3/2003 |
| JP | 2004-052094 A | | 2/2004 |
| JP | 2006-331619 A | | 12/2006 |
| JP | 2013-147734 A | | 8/2013 |
| JP | 2014-177696 A | | 9/2014 |

* cited by examiner

Primary Examiner — John J Brayton
(74) Attorney, Agent, or Firm — Howson & Howson LLP

(57) ABSTRACT

Provided is a master alloy for a sputtering target, wherein, when elements constituting the master alloy are following X1, X2, Y1, Y2, Y2, and Y3; specifically, where X1 is one or two types of Ta or W; X2 is at least one type of Ru, Mo, Nb or Hf; Y1 is one or two types of Cr or Mn; Y2 is one or two types of Co or Ni; and Y3 is one or two types of Ti or V, the master alloy comprises any one combination of X1-Y1, X1-Y2, X1-Y3, X2-Y1, and X2-Y2 of the foregoing constituent elements. The present invention consequently yields superior effects of being able to obtain a sintered sputtering target with few defects and having a high-density and uniform alloy composition, and, by using this target, to realize the deposition of an alloy barrier film with uniform quality and few particles at a high speed.

5 Claims, No Drawings

MASTER ALLOY FOR SPUTTERING TARGET AND METHOD FOR PRODUCING SPUTTERING TARGET

BACKGROUND

The present invention relates to a master alloy for a sputtering target, which enables the deposition of a film with a uniform quality by achieving uniformity of the composition of the raw material powder and the internal texture through use of the master alloy; and a method of producing the sputtering target.

As a next-generation barrier metal, a combination of alloy elements comprising the characteristics as an alloy film considered to be a candidate of a barrier film to be used as a "pair" with a Cu seed layer, and a production method thereof are being desired.

For example, in cases that the foregoing alloy is an alloy containing X as the main component and further containing a Y component, it is normally used as an alloy (XY alloy) in which the Y component falls within a range of 0.1 to 40 at %. In the case of this kind of alloy, in a combination of X having a high melting point (for instance, Ta: melting point of 3017° C.) and Y having a low boiling point (for instance, Mn: boiling point of 2061° C.), Y will become volatilized under the conditions of melting X, and therefore it is impossible to control the composition with the melting method.

When reviewing publications, Patent Document 1 describes a sputtering target capable of depositing an antiferromagnetic reinforced film having high compositional uniformity, an antiferromagnetic film, a magnetoresistive sensor comprising said film, a magnetic head, and a magnetoresistive effect-type random access memory.

Specifically, Patent Document 1 describes a sputtering target composed of at least one type of element selected from nickel, palladium, platinum, cobalt, rhodium, iridium, vanadium, niobium, tantalum, copper, silver, gold, ruthenium, osmium, chromium, molybdenum, tungsten and rhenium, and manganese, wherein the number of defects per a sputtered surface of 1 cm$^2$ is 10 defects or less.

Furthermore, Patent Document 1 describes an antiferromagnetic film which is deposited using the foregoing sputtering target, a magnetoresistive sensor comprising the foregoing antiferromagnetic film, a tunnel magnetoresistive sensor comprising the foregoing antiferromagnetic film, a magnetic head comprising the foregoing magnetoresistive sensor, and a magnetoresistive effect-type random access memory comprising the foregoing tunnel magnetoresistive sensor.

Furthermore, Patent Document 2 describes a sputtering target composed of at least one type of R element selected from Ni, Pd, Pt, Co, Rh, Ir, V, Nb, Ta, Cu, Ag, Au, Ru, Os, Cr, Mo, W and Re, and Mn, wherein the sputtering target comprises, as at least a part of the target texture, at least one type selected from an alloy phase and a compound phase of the R element and Mn; and further describes an antiferromagnetic film formed by using the foregoing sputtering target, and a magnetoresistive sensor.

Furthermore, Patent Document 3 describes a sputtering target composed of at least one type of R element selected from Ni, Pd, Pt, Co, Rh, Ir, V, Nb, Ta, Cu, Ag, Au, Ru, Os, Cr, Mo, W and Re, and Mn, wherein the oxygen content in the sputtering target is 1 wt % or less (including 0). The antiferromagnetic film 3 is obtained by subjecting this kind of sputtering target to sputter deposition. Patent Document 3 describes that the antiferromagnetic film 3 is used, for instance, as an exchange coupled film 2 by being laminated with a ferromagnetic film 4, and that this kind of exchange coupled film 2 is used in a magnetoresistive sensor or the like.

Nevertheless, all of these Patent Documents encounter the problem where, in cases where one of the alloy components has a high melting point and the other component has a low boiling point, one of the metal components become volatilized upon melting these components, and the intended alloy composition will undergo a change and become uncontrollable. But no solution for resolving the foregoing problem is disclosed.

CITATION LIST

Patent Documents

Patent Document 1: JP 2003-064473 A
Patent Document 2: WO 98/22636
Patent Document 3: JP 2000-160332 A

SUMMARY

Conventionally, in cases where one of the alloy components has a high melting point and the other component has a low boiling point, there is a problem in that one of the metal components become volatilized when melting is performed to produce an alloy, and the intended alloy composition will undergo a change and become uncontrollable. The present invention provides a sputtering target capable of resolving the foregoing problem and a method of producing such a sputtering target. Thus, an object of the present invention is to obtain a sintered sputtering target with few defects and having a high-density and uniform alloy composition, and, by using this target, to realize the deposition of an alloy barrier film with uniform quality and few particles at a high speed.

In order to achieve the foregoing object, as a result of intense study, the present inventors discovered that, by using a master alloy, it is possible to cause the composition of the raw material powder and the internal texture to be uniform, and realize the deposition of a film with a uniform quality. Based on the foregoing discovery, the present invention provides the following invention of 1) to 8).

1) A master alloy for a sputtering target, wherein, when elements constituting the master alloy are following X1, X2, Y1, Y2, Y2, and Y3; specifically, where:
X1 is one or two types of Ta or W;
X2 is at least one type of Ru, Mo, Nb or Hf;
Y1 is one or two types of Cr or Mn;
Y2 is one or two types of Co or Ni; and
Y3 is one or two types of Ti or V,
the master alloy comprises any one combination of X1-Y1, X1-Y2, X1-Y3, X2-Y1, and X2-Y2 of the foregoing constituent elements.

2) The master alloy for a sputtering target according to 1) above, wherein a composition ratio of the Y1, Y2, or Y3 falls within a range of 50.0 to 80.0 at % of an entire composition constituting the master alloy.

3) The master alloy for a sputtering target according to 1) or 2) above, wherein X1 or X2 as one constituent metal constituting the master alloy and Y1, Y2, or Y3 as another constituent metal constituting the master alloy form an intermetallic compound or a complete solid solution.

4) A method of producing a sputtering target, wherein the master alloy for a sputtering target according to any one of 1) to 3) above is pulverized, and mixed with a powder composed of the X1 or X2, and the mixed powder is sintered to obtain a sputtering target material for a barrier metal.

5) The method of producing a sputtering target according to 4) above, wherein the mixing is performed so that a composition of Y1, Y2, or Y3 constituting the master alloy falls within a range of 0.1 to 40.0 at %, and the mixed powder is sintered.

6) The sputtering target according to any one of 1) to 5) above, wherein a variation in an in-plane metal composition of Y1, Y2, or Y3 of the sputtering target is 30% or less.

7) The sputtering target according to any one of 1) to 5) above, wherein a variation in an in-plane metal composition of Y1, Y2, or Y3 of the sputtering target is 20% or less.

8) The sputtering target according to any one of 1) to 5) above, wherein a variation in an in-plane metal composition of Y1, Y2, or Y3 of the sputtering target is 15% or less.

The present invention provides a master alloy for a sputtering target, which enables the deposition of a film with a uniform quality by achieving uniformity of the composition of the raw material powder and the internal texture through use of the master alloy; and a method of producing the sputtering target. The present invention consequently yields superior effects of being able to obtain a sintered sputtering target with few defects and having a high-density and uniform alloy composition, and, by using this target, to realize the deposition of an alloy barrier film with uniform quality and few particles at a high speed.

DETAILED DESCRIPTION

As described above, the present invention provides a master alloy for a sputtering target, wherein, when elements constituting the master alloy are following X1, X2, Y1, Y2, Y2, and Y3; specifically, where:

X1 is one or two types of Ta or W;
X2 is at least one type of Ru, Mo, Nb or Hf;
Y1 is one or two types of Cr or Mn;
Y2 is one or two types of Co or Ni; and
Y3 is one or two types of Ti or V, the master alloy comprises any one combination of X1-Y1, X1-Y2, X1-Y3, X2-Y1, and X2-Y2 of the foregoing constituent elements. The master alloy having the foregoing composition can be prepared with the melting method.

When providing the explanation by collectively referring to X1 and X2 above as "X", and collectively referring to Y1, Y2, and Y3 above as "Y", the boiling point will decrease as the composition of Y increases, and therefore a master alloy having a composition of a high Y content can be melted under conditions of suppressing the volatilization of Y.

Furthermore, the melted master alloy can be pulverized; and, by selecting a compositional range of 50.0 to 80.0 at % Y, in which Y can exist as an intermetallic compound phase without including a composition of Y itself, for minimizing the reaction during sintering after mixing the pulverized powder with an X powder for controlling the composition, it is possible to obtain a raw material powder for controlling the composition.

Moreover, by mixing the pulverized master alloy and a metal powder and sintering the mixed powder, it is possible to produce a TG having a prescribed composition and in which the in-plane composition is uniform.

It is thereby possible to obtain a target with few defects and having a high-density and uniform alloy composition. By using this target, it is possible to realize the deposition of an alloy barrier film of an XY component with uniform quality and few particles at a high speed. Moreover, it is also possible to produce a target having a size of 300 mm.

The composition ratio of Y1, Y2, or Y3 above preferably falls within a range of 50.0 to 80.0 at % of the entire composition constituting the master alloy. This is based on the reason that as the composition approaches X, the melting point will generally increase and the Y alloy will become volatilized, and, as the composition approaches Y, a Y monophase region will become generated.

Preferably, X1 or X2 as one constituent metal constituting the master alloy and Y1, Y2, or Y3 as another constituent metal constituting the master alloy form an intermetallic compound or a complete solid solution. This is effective and important for causing the target texture to be uniform.

Upon producing a sputtering target, the master alloy for a sputtering target is pulverized, and mixed with a powder composed of the X1 or X2, and the mixed powder is sintered to obtain a sputtering target material for a barrier metal. It is thereby possible to obtain a target with few defects and having a high-density and uniform alloy composition.

Preferably, the mixing is performed so that a composition of Y1, Y2, or Y3 constituting the master alloy falls within a range of 0.1 to 40.0 at %, and the mixed powder is sintered.

The variation in an in-plane metal composition of Y1, Y2, or Y3 of the sputtering target is 30% or less, preferably 20% or less, and more preferably 15% or less.

Note that, upon measuring the variation, the composition measurement is performed at arbitrary in-plane points of the target (for instance, 9 locations on cross lines in a plane of the target), and "the value of (maximum value−minimum value)/maximum value×100%" may be defined as being the variation.

EXAMPLES

The Examples and Comparative Examples of the present invention are now explained. Note that these Examples and Comparative Examples are described for facilitating the understanding of the present invention, and it should be understood that the subject matter of this invention is not limited by these Examples and Comparative Examples.

Example 1

In Example 1, a material having a composition of W-75 at % V was melted to prepare a master alloy, and this master alloy was pulverized to obtain a powder. Subsequently, a W powder was further added thereto to adjust the composition so that the total amount of V would fall within a range of 0.1 to 40.0 at %, the obtained powder was subject to vacuum sintering, and a target composed of a material having a composition of W-26 at % V was prepared.

The press temperature during sintering was set to 1550° C. Variation of the master alloy composition (V component) was 2.6%, and the compositional variation was small. Moreover, the master alloy could be pulverized easily. The results are shown in Table 1.

| | X | Y | Intended composition X (at %) | Actual composition Y (at %) | Press temperature | Melting temperature | Production method | Intended composition of master alloy (at %) | Master alloy melting temperature | Variation in target composition |
|---|---|---|---|---|---|---|---|---|---|---|
| Example 1 | W | V | 26 | 26 | 1550° C. | — | Master alloying | 75 | 2200° C. | 2.6% |
| Example 2 | W | Ti | 10 | 10.1 | 1550° C. | — | Master alloying | 66 | 1800° C. | 2.4% |
| Example 3 | W | Co | 1 | 1.4 | 1350° C. | — | Master alloying | 57 | 1600° C. | 4.9% |
| Example 4 | W | Ni | 19 | 19.2 | 1350° C. | — | Master alloying | 58 | 1600° C. | 8.5% |
| Example 5 | W | Cr | 21 | 21.4 | 1550° C. | — | Master alloying | 73 | 2000° C. | 3.1% |
| Example 6 | W | Mn | 28 | 27.5 | 1150° C. | — | Master alloying | 50 | 1400° C. | 1.5% |
| Example 7 | Ta | V | 6 | 6.3 | 1550° C. | — | Master alloying | 71 | 2000° C. | 1.0% |
| Example 8 | Ta | Ti | 33 | 32.8 | 1550° C. | — | Master alloying | 55 | 1800° C. | 8.8% |
| Example 9 | Ta | Co | 37 | 37.4 | 1200° C. | — | Master alloying | 60 | 1700° C. | 1.7% |
| Example 10 | Ta | Ni | 11 | 10.5 | 1250° C. | — | Master alloying | 52 | 1600° C. | 7.6% |
| Example 11 | Ta | Cr | 3 | 2.9 | 1550° C. | — | Master alloying | 63 | 1800° C. | 9.7% |
| Example 12 | Ta | Mn | 15 | 14.7 | 1100° C. | — | Master alloying | 61 | 1400° C. | 9.9% |
| Example 13 | Mo | Co | 38 | 38.1 | 1250° C. | — | Master alloying | 59 | 1500° C. | 5.5% |
| Example 14 | Mo | Ni | 30 | 30.2 | 1250° C. | — | Master alloying | 72 | 1500° C. | 1.1% |
| Example 15 | Mo | Cr | 5 | 5.4 | 1550° C. | — | Master alloying | 66 | 1900° C. | 4.0% |
| Example 16 | Mo | Mn | 21 | 21.2 | 1100° C. | — | Master alloying | 75 | 1400° C. | 4.9% |
| Example 17 | Nb | Co | 18 | 17.5 | 1150° C. | — | Master alloying | 67 | 1500° C. | 5.8% |
| Example 18 | Nb | Ni | 3 | 3.2 | 1100° C. | — | Master alloying | 57 | 1500° C. | 10.0% |
| Example 19 | Nb | Cr | 21 | 20.5 | 1550° C. | — | Master alloying | 71 | 1700° C. | 7.9% |
| Example 20 | Nb | Mn | 18 | 17.8 | 1100° C. | — | Master alloying | 75 | 1300° C. | 2.2% |
| Example 21 | Ru | Cr | 13 | 12.6 | 1550° C. | — | Master alloying | 65 | 1700° C. | 3.1% |
| Example 22 | Ru | Mn | 11 | 11.2 | 1200° C. | — | Master alloying | 50 | 1400° C. | 4.4% |
| Example 23 | Hf | Cr | 14 | 13.8 | 1500° C. | — | Master alloying | 53 | 1800° C. | 9.3% |
| Example 24 | Hf | Mn | 8 | 8.2 | 1100° C. | — | Master alloying | 56 | 1400° C. | 1.6% |
| Comparative Example 1 | W | V | 26 | — | — | Not producible | Melting method | — | — | — |
| Comparative Example 2 | W | Ti | 10 | — | — | Not producible | Melting method | — | — | — |
| Comparative Example 3 | W | Co | 1 | — | — | Not producible | Melting method | — | — | — |
| Comparative Example 4 | W | Ni | 19 | — | — | Not producible | Melting method | — | — | — |
| Comparative Example 5 | W | Cr | 21 | — | — | Not producible | Melting method | — | — | — |
| Comparative Example 6 | W | Mn | 28 | — | — | Not producible | Melting method | — | — | — |
| Comparative Example 7 | Ta | V | 6 | 3.2 | — | 3100° C. | Melting method | — | — | 42.5% |
| Comparative Example 8 | Ta | Ti | 33 | 14.6 | — | 3100° C. | Melting method | — | — | 39.7% |
| Comparative Example 9 | Ta | Co | 37 | — | — | Not producible | Melting method | — | — | — |
| Comparative Example 10 | Ta | Ni | 11 | — | — | Not producible | Melting method | — | — | — |
| Comparative Example 11 | Ta | Cr | 3 | — | — | Not producible | Melting method | — | — | — |
| Comparative Example 12 | Ta | Mn | 15 | — | — | Not producible | Melting method | — | — | — |
| Comparative Example 13 | Mc | Co | 38 | 32.3 | — | 2700° C. | Melting method | — | — | 16.2% |
| Comparative Example 14 | Mo | Ni | 30 | 21.1 | — | 2700° C. | Melting method | — | — | 26.8% |
| Comparative Example 15 | Mo | Cr | 5 | — | — | Not producible | Melting method | — | — | — |
| Comparative Example 16 | Mo | Mn | 21 | — | — | Not producible | Melting method | — | — | — |
| Comparative Example 17 | Nb | Co | 18 | 14.1 | — | 2550° C. | Melting method | — | — | 32.0% |
| Comparative Example 18 | Nb | Ni | 3 | 1.7 | — | 2550° C. | Melting method | — | — | 41.5% |
| Comparative Example 19 | Nb | Cr | 21 | 9.2 | — | 2550° C. | Melting method | — | — | 31.6% |
| Comparative Example 20 | Nb | Mn | 18 | — | — | Not producible | Melting method | — | — | — |
| Comparative Example 21 | Ru | Cr | 13 | 9.4 | — | 2400° C. | Melting method | — | — | 28.3% |
| Comparative Example 22 | Ru | Mn | 11 | — | — | Not producible | Melting method | — | — | — |
| Comparative Example 23 | Hf | Cr | 14 | 10 | — | 2300° C. | Melting method | — | — | 29.6% |
| Comparative Example 24 | Hf | Mn | 8 | — | — | Not producible | Melting method | — | — | — |

Example 2

In Example 2, a material having a composition of W-66 at % Ti was melted to prepare a master alloy, and this master alloy was pulverized to obtain a powder. Subsequently, a W powder was further added thereto to adjust the composition so that the total amount of Ti would fall within a range of 0.1 to 40.0 at %, the obtained powder was subject to vacuum sintering, and a target composed of a material having a composition of W-10.1 at % Ti was prepared.

The press temperature during sintering was set to 1550° C. Variation of the master alloy composition (Ti component) was 2.4%, and the compositional variation was small. Moreover, the master alloy could be pulverized easily. The results are similarly shown in Table 1.

Example 3

In Example 3, a material having a composition of W-57 at % Co was melted to prepare a master alloy, and this master alloy was pulverized to obtain a powder. Subsequently, a W powder was further added thereto to adjust the composition so that the total amount of Co would fall within a range of 0.1 to 40.0 at %, the obtained powder was subject to vacuum sintering, and a target composed of a material having a composition of W-1.4 at % Co was prepared.

The press temperature during sintering was set to 1350° C. Variation of the master alloy composition (Co component) was 4.9%, and the compositional variation was small. Moreover, the master alloy could be pulverized easily. The results are similarly shown in Table 1.

Example 4

In Example 4, a material having a composition of W-58 at % Ni was melted to prepare a master alloy, and this master alloy was pulverized to obtain a powder. Subsequently, a W powder was further added thereto to adjust the composition so that the total amount of Ni would fall within a range of 0.1 to 40.0 at %, the obtained powder was subject to vacuum sintering, and a target composed of a material having a composition of W-19.2 at % Ni was prepared.

The press temperature during sintering was set to 1350° C. Variation of the master alloy composition (Ni component) was 8.5%, and the compositional variation was small. Moreover, the master alloy could be pulverized easily. The results are similarly shown in Table 1.

Example 5

In Example 5, a material having a composition of W-73 at % Cr was melted to prepare a master alloy, and this master alloy was pulverized to obtain a powder. Subsequently, a W powder was further added thereto to adjust the composition so that the total amount of Cr would fall within a range of 0.1 to 40.0 at %, the obtained powder was subject to vacuum sintering, and a target composed of a material having a composition of W-21.4 at % Cr was prepared.

The press temperature during sintering was set to 1550° C. Variation of the master alloy composition (Cr component) was 3.1%, and the compositional variation was small. Moreover, the master alloy could be pulverized easily. The results are similarly shown in Table 1.

Example 6

In Example 6, a material having a composition of W-50 at % Mn was melted to prepare a master alloy, and this master alloy was pulverized to obtain a powder. Subsequently, a W powder was further added thereto to adjust the composition so that the total amount of Mn would fall within a range of 0.1 to 40.0 at %, the obtained powder was subject to vacuum sintering, and a target composed of a material having a composition of W-27.5 at % Mn was prepared.

The press temperature during sintering was set to 1150° C. Variation of the master alloy composition (Mn component) was 1.5%, and the compositional variation was small. Moreover, the master alloy could be pulverized easily. The results are similarly shown in Table 1.

Example 7

In Example 7, a material having a composition of Ta-71 at % V was melted to prepare a master alloy, and this master alloy was pulverized to obtain a powder. Subsequently, a Ta powder was further added thereto to adjust the composition so that the total amount of V would fall within a range of 0.1 to 40.0 at %, the obtained powder was subject to vacuum sintering, and a target composed of a material having a composition of Ta-6.3 at % V was prepared.

The press temperature during sintering was set to 1550° C. Variation of the master alloy composition (V component) was 1.0%, and the compositional variation was small. Moreover, the master alloy could be pulverized easily. The results are similarly shown in Table 1.

Example 8

In Example 8, a material having a composition of Ta-55 at % Ti was melted to prepare a master alloy, and this master alloy was pulverized to obtain a powder. Subsequently, a Ta powder was further added thereto to adjust the composition so that the total amount of Ti would fall within a range of 0.1 to 40.0 at %, the obtained powder was subject to vacuum sintering, and a target composed of a material having a composition of Ta-32.8 at % Ti was prepared.

The press temperature during sintering was set to 1550° C. Variation of the master alloy composition (V component) was 8.8%, and the compositional variation was small. Moreover, the master alloy could be pulverized easily. The results are similarly shown in Table 1.

Example 9

In Example 9, a material having a composition of Ta-60 at % Co was melted to prepare a master alloy, and this master alloy was pulverized to obtain a powder. Subsequently, a Ta powder was further added thereto to adjust the composition so that the total amount of Co would fall within a range of 0.1 to 40.0 at %, the obtained powder was subject to vacuum sintering, and a target composed of a material having a composition of Ta-37.4 at % Co was prepared.

The press temperature during sintering was set to 1200° C. Variation of the master alloy composition (Co component) was 1.7%, and the compositional variation was small. Moreover, the master alloy could be pulverized easily. The results are similarly shown in Table 1.

Example 10

In Example 10, a material having a composition of Ta-52 at % Ni was melted to prepare a master alloy, and this master alloy was pulverized to obtain a powder. Subsequently, a Ta powder was further added thereto to adjust the composition so that the total amount of Ni would fall within a range of 0.1 to 40.0 at %, the obtained powder was subject to vacuum sintering, and a target composed of a material having a composition of Ta-10.5 at % Ni was prepared.

The press temperature during sintering was set to 1250° C. Variation of the master alloy composition (Ni component) was 7.6%, and the compositional variation was small. Moreover, the master alloy could be pulverized easily. The results are similarly shown in Table 1.

Example 11

In Example 11, a material having a composition of Ta-63 at % Cr was melted to prepare a master alloy, and this master alloy was pulverized to obtain a powder. Subsequently, a Ta powder was further added thereto to adjust the composition so that the total amount of Cr would fall within a range of 0.1 to 40.0 at %, the obtained powder was subject to vacuum sintering, and a target composed of a material having a composition of Ta-2.9 at % Cr was prepared.

The press temperature during sintering was set to 1550° C. Variation of the master alloy composition (Cr component) was 9.7%, and the compositional variation was small. Moreover, the master alloy could be pulverized easily. The results are similarly shown in Table 1.

Example 12

In Example 12, a material having a composition of Ta-61 at % Mn was melted to prepare a master alloy, and this master alloy was pulverized to obtain a powder. Subsequently, a Ta powder was further added thereto to adjust the composition so that the total amount of Mn would fall within a range of 0.1 to 40.0 at %, the obtained powder was subject to vacuum sintering, and a target composed of a material having a composition of Ta-14.7 at % Mn was prepared.

The press temperature during sintering was set to 1100° C. Variation of the master alloy composition (Mn component) was 9.9%, and the compositional variation was small. Moreover, the master alloy could be pulverized easily. The results are similarly shown in Table 1.

Example 13

In Example 13, a material having a composition of Mo-59 at % Co was melted to prepare a master alloy, and this master alloy was pulverized to obtain a powder. Subsequently, a Mo powder was further added thereto to adjust the composition so that the total amount of Co would fall within a range of 0.1 to 40.0 at %, the obtained powder was subject to vacuum sintering, and a target composed of a material having a composition of Mo-38.1 at % Co was prepared.

The press temperature during sintering was set to 1250° C. Variation of the master alloy composition (Co component) was 5.5%, and the compositional variation was small. Moreover, the master alloy could be pulverized easily. The results are similarly shown in Table 1.

Example 14

In Example 14, a material having a composition of Mo-72 at % Ni was melted to prepare a master alloy, and this master alloy was pulverized to obtain a powder. Subsequently, a Mo powder was further added thereto to adjust the composition so that the total amount of Ni would fall within a range of 0.1 to 40.0 at %, the obtained powder was subject to vacuum sintering, and a target composed of a material having a composition of Mo-30.2 at % Ni was prepared.

The press temperature during sintering was set to 1250° C. Variation of the master alloy composition (Ni component) was 1.1%, and the compositional variation was small. Moreover, the master alloy could be pulverized easily. The results are similarly shown in Table 1.

Example 15

In Example 15, a material having a composition of Mo-66 at % Cr was melted to prepare a master alloy, and this master alloy was pulverized to obtain a powder. Subsequently, a Mo powder was further added thereto to adjust the composition so that the total amount of Cr would fall within a range of 0.1 to 40.0 at %, the obtained powder was subject to vacuum sintering, and a target composed of a material having a composition of Mo-5.4 at % Cr was prepared.

The press temperature during sintering was set to 1550° C. Variation of the master alloy composition (Cr component) was 4.0%, and the compositional variation was small. Moreover, the master alloy could be pulverized easily. The results are similarly shown in Table 1.

Example 16

In Example 16, a material having a composition of Mo-75 at % Mn was melted to prepare a master alloy, and this master alloy was pulverized to obtain a powder. Subsequently, a Mo powder was further added thereto to adjust the composition so that the total amount of Mn would fall within a range of 0.1 to 40.0 at %, the obtained powder was subject to vacuum sintering, and a target composed of a material having a composition of Mo-21.2 at % Mn was prepared.

The press temperature during sintering was set to 1100° C. Variation of the master alloy composition (Mn component) was 4.9%, and the compositional variation was small. Moreover, the master alloy could be pulverized easily. The results are similarly shown in Table 1.

Example 17

In Example 17, a material having a composition of Nb-67 at % Co was melted to prepare a master alloy, and this master alloy was pulverized to obtain a powder. Subsequently, a Nb powder was further added thereto to adjust the composition so that the total amount of Co would fall within a range of 0.1 to 40.0 at %, the obtained powder was subject to vacuum sintering, and a target composed of a material having a composition of Nb-17.5 at % Co was prepared.

The press temperature during sintering was set to 1150° C. Variation of the master alloy composition (Co component) was 5.8%, and the compositional variation was small. Moreover, the master alloy could be pulverized easily. The results are similarly shown in Table 1.

Example 18

In Example 18, a material having a composition of Nb-57 at % Ni was melted to prepare a master alloy, and this master alloy was pulverized to obtain a powder. Subsequently, a Nb powder was further added thereto to adjust the composition so that the total amount of Ni would fall within a range of 0.1 to 40.0 at %, the obtained powder was subject to vacuum sintering, and a target composed of a material having a composition of Nb-3.2 at % Ni was prepared.

The press temperature during sintering was set to 1100° C. Variation of the master alloy composition (Ni component) was 10.0%, and the compositional variation was small.

Moreover, the master alloy could be pulverized easily. The results are similarly shown in Table 1.

Example 19

In Example 19, a material having a composition of Nb-71 at % Cr was melted to prepare a master alloy, and this master alloy was pulverized to obtain a powder. Subsequently, a Nb powder was further added thereto to adjust the composition so that the total amount of Cr would fall within a range of 0.1 to 40.0 at %, the obtained powder was subject to vacuum sintering, and a target composed of a material having a composition of Nb-20.5 at % Cr was prepared.

The press temperature during sintering was set to 1550° C. Variation of the master alloy composition (Ni component) was 7.9%, and the compositional variation was small. Moreover, the master alloy could be pulverized easily. The results are similarly shown in Table 1.

Example 20

In Example 20, a material having a composition of Nb-75 at % Mn was melted to prepare a master alloy, and this master alloy was pulverized to obtain a powder. Subsequently, a Nb powder was further added thereto to adjust the composition so that the total amount of Mn would fall within a range of 0.1 to 40.0 at %, the obtained powder was subject to vacuum sintering, and a target composed of a material having a composition of Nb-17.8 at % Mn was prepared.

The press temperature during sintering was set to 1100° C. Variation of the master alloy composition (Mn component) was 2.2%, and the compositional variation was small. Moreover, the master alloy could be pulverized easily. The results are similarly shown in Table 1.

Example 21

In Example 21, a material having a composition of Ru-65 at % Cr was melted to prepare a master alloy, and this master alloy was pulverized to obtain a powder. Subsequently, a Ru powder was further added thereto to adjust the composition so that the total amount of Cr would fall within a range of 0.1 to 40.0 at %, the obtained powder was subject to vacuum sintering, and a target composed of a material having a composition of Ru-12.6 at % Cr was prepared.

The press temperature during sintering was set to 1550° C. Variation of the master alloy composition (Cr component) was 3.1%, and the compositional variation was small. Moreover, the master alloy could be pulverized easily. The results are similarly shown in Table 1.

Example 22

In Example 22, a material having a composition of Ru-50 at % Mn was melted to prepare a master alloy, and this master alloy was pulverized to obtain a powder. Subsequently, a Ru powder was further added thereto to adjust the composition so that the total amount of Mn would fall within a range of 0.1 to 40.0 at %, the obtained powder was subject to vacuum sintering, and a target composed of a material having a composition of Ru-11.2 at % Mn was prepared.

The press temperature during sintering was set to 1200° C. Variation of the master alloy composition (Mn component) was 4.4%, and the compositional variation was small. Moreover, the master alloy could be pulverized easily. The results are similarly shown in Table 1.

Example 23

In Example 23, a material having a composition of Hf-53 at % Cr was melted to prepare a master alloy, and this master alloy was pulverized to obtain a powder. Subsequently, a Hf powder was further added thereto to adjust the composition so that the total amount of Cr would fall within a range of 0.1 to 40.0 at %, the obtained powder was subject to vacuum sintering, and a target composed of a material having a composition of Hf-13.8 at % Cr was prepared.

The press temperature during sintering was set to 1500° C. Variation of the master alloy composition (Cr component) was 9.3%, and the compositional variation was small. Moreover, the master alloy could be pulverized easily. The results are similarly shown in Table 1.

Example 24

In Example 24, a material having a composition of Hf-56 at % Mn was melted to prepare a master alloy, and this master alloy was pulverized to obtain a powder. Subsequently, a Hf powder was further added thereto to adjust the composition so that the total amount of Mn would fall within a range of 0.1 to 40.0 at %, the obtained powder was subject to vacuum sintering, and a target composed of a material having a composition of Hf-8.2 at % Mn was prepared.

The press temperature during sintering was set to 1100° C. Variation of the master alloy composition (Mn component) was 1.6%, and the compositional variation was small. Moreover, the master alloy could be pulverized easily. The results are similarly shown in Table 1.

Comparative Example 1

In Comparative Example 1, V was added to W in an amount of 26 at %, and an attempt was made to melt the obtained product and produce an alloy having the same component composition. Nevertheless, it was not possible to melt this alloy material and produce the intended alloy. The results are similarly shown in Table 1.

Comparative Example 2

In Comparative Example 2, Ti was added to W in an amount of 10 at %, and an attempt was made to melt the obtained product and produce an alloy having the same component composition. Nevertheless, it was not possible to melt this alloy material and produce the intended alloy. The results are similarly shown in Table 1.

Comparative Example 3

In Comparative Example 3, Co was added to W in an amount of 1 at %, and an attempt was made to melt the obtained product and produce an alloy having the same component composition. Nevertheless, it was not possible to melt this alloy material and produce the intended alloy. The results are similarly shown in Table 1.

Comparative Example 4

In Comparative Example 4, Ni was added to W in an amount of 19 at %, and an attempt was made to melt the obtained product and produce an alloy having the same component composition. Nevertheless, it was not possible to melt this alloy material and produce the intended alloy. The results are similarly shown in Table 1.

Comparative Example 5

In Comparative Example 5, Cr was added to W in an amount of 21 at %, and an attempt was made to melt the obtained product and produce an alloy having the same component composition. Nevertheless, it was not possible to melt this alloy material and produce the intended alloy. The results are similarly shown in Table 1.

Comparative Example 6

In Comparative Example 6, Mn was added to W in an amount of 28 at %, and an attempt was made to melt the obtained product and produce an alloy having the same component composition. Nevertheless, it was not possible to melt this alloy material and produce the intended alloy. The results are similarly shown in Table 1.

Comparative Example 7

In Comparative Example 7, V was added to Ta in an amount of 6 at %, and an attempt was made to melt the obtained product at 3100° C. and produce an alloy having the same component composition. In this case, the compositional variation increased to 42.5%, and it was unfit for actual production. The results are similarly shown in Table 1.

Comparative Example 8

In Comparative Example 8, Ti was added to Ta in an amount of 33 at %, and an attempt was made to melt the obtained product at 3100° C. and produce an alloy having the same component composition. In this case, the compositional variation increased to 39.7%, and it was unfit for actual production. The results are similarly shown in Table 1.

Comparative Example 9

In Comparative Example 9, Co was added to Ta in an amount of 37 at %, and an attempt was made to melt the obtained product and produce an alloy having the same component composition. Nevertheless, it was not possible to melt this alloy material and produce the intended alloy. The results are similarly shown in Table 1.

Comparative Example 10

In Comparative Example 10, Ni was added to Ta in an amount of 11 at %, and an attempt was made to melt the obtained product and produce an alloy having the same component composition. Nevertheless, it was not possible to melt this alloy material and produce the intended alloy. The results are similarly shown in Table 1.

Comparative Example 11

In Comparative Example 11, Cr was added to Ta in an amount of 3 at %, and an attempt was made to melt the obtained product and produce an alloy having the same component composition. Nevertheless, it was not possible to melt this alloy material and produce the intended alloy. The results are similarly shown in Table 1.

Comparative Example 12

In Comparative Example 12, Mn was added to Ta in an amount of 15 at %, and an attempt was made to melt the obtained product and produce an alloy having the same component composition. Nevertheless, it was not possible to melt this alloy material and produce the intended alloy. The results are similarly shown in Table 1.

Comparative Example 13

In Comparative Example 13, Co was added to Mo in an amount of 38 at %, and an attempt was made to melt the obtained product at 2700° C. and produce an alloy having the same component composition. In this case, the compositional variation increased to 16.2%, and it was unfit for actual production. The results are similarly shown in Table 1.

Comparative Example 14

In Comparative Example 14, Ni was added to Mo in an amount of 30 at %, and an attempt was made to melt the obtained product at 2700° C. and produce an alloy having the same component composition. In this case, the compositional variation increased to 26.8%, and it was unfit for actual production. The results are similarly shown in Table 1.

Comparative Example 15

In Comparative Example 15, Cr was added to Mo in an amount of 5 at %, and an attempt was made to melt the obtained product and produce an alloy having the same component composition. Nevertheless, it was not possible to melt this alloy material and produce the intended alloy. The results are similarly shown in Table 1.

Comparative Example 16

In Comparative Example 16, Mn was added to Mo in an amount of 21 at %, and an attempt was made to melt the obtained product and produce an alloy having the same component composition. Nevertheless, it was not possible to melt this alloy material and produce the intended alloy. The results are similarly shown in Table 1.

Comparative Example 17

In Comparative Example 17, Co was added to Nb in an amount of 18 at %, and an attempt was made to melt the obtained product at 2550° C. and produce an alloy having the same component composition. In this case, the compositional variation increased to 32.0%, and it was unfit for actual production. The results are similarly shown in Table 1.

Comparative Example 18

In Comparative Example 18, Ni was added to Nb in an amount of 3 at %, and an attempt was made to melt the obtained product at 2550° C. and produce an alloy having the same component composition. In this case, the compositional variation increased to 41.5%, and it was unfit for actual production. The results are similarly shown in Table 1.

Comparative Example 19

In Comparative Example 19, Cr was added to Nb in an amount of 21 at %, and an attempt was made to melt the obtained product at 2550° C. and produce an alloy having the same component composition. In this case, the compositional variation increased to 31.6%, and it was unfit for actual production. The results are similarly shown in Table 1.

Comparative Example 20

In Comparative Example 20, Mn was added to Nb in an amount of 18 at %, and an attempt was made to melt the obtained product and produce an alloy having the same component composition. Nevertheless, it was not possible to melt this alloy material and produce the intended alloy. The results are similarly shown in Table 1.

Comparative Example 21

In Comparative Example 21, Cr was added to Ru in an amount of 13 at %, and an attempt was made to melt the obtained product at 2400° C. and produce an alloy having the same component composition. In this case, the compositional variation increased to 28.3%, and it was unfit for actual production. The results are similarly shown in Table 1.

Comparative Example 22

In Comparative Example 22, Mn was added to Ru in an amount of 11 at %, and an attempt was made to melt the obtained product and produce an alloy having the same component composition. Nevertheless, it was not possible to melt this alloy material and produce the intended alloy. The results are similarly shown in Table 1.

Comparative Example 23

In Comparative Example 23, Cr was added to Hf in an amount of 14 at %, and an attempt was made to melt the obtained product at 2300° C. and produce an alloy having the same component composition. In this case, the compositional variation increased to 29.6%, and it was unfit for actual production. The results are similarly shown in Table 1.

Comparative Example 24

In Comparative Example 22, Mn was added to Hf in an amount of 8 at %, and an attempt was made to melt the obtained product and produce an alloy having the same component composition. Nevertheless, it was not possible to melt this alloy material and produce the intended alloy. The results are similarly shown in Table 1.

In foregoing Comparative Examples 1 to 24, the elements shown in Table 1 were respectively added to W, Ta, Mo, Nb, Ru, and Hf that are high melting point metals, and attempts were made to melt the obtained product and produce an alloy. However, it is evident that, in all of these cases, the intended alloy could not be produced, or the compositional variation increased and it was unfit for actual production.

The present invention provides a master alloy for a sputtering target, which enables the deposition of a film with a uniform quality by achieving uniformity of the composition of the raw material powder and the internal texture through use of the master alloy; and a method of producing the sputtering target. The present invention consequently yields superior effects of being able to obtain a sintered sputtering target with few defects and having a high-density and uniform alloy composition, and, by using this target, to realize the deposition of an alloy barrier film with uniform quality and few particles at a high speed. The present invention is particularly effective in producing a film in which the compositional variation thereof needs to be suppressed, such as with a gate film in a semiconductor device.

The invention claimed is:

1. A method of producing a sputtering target, comprising the steps of:
    pulverizing a master alloy that consists of any one combination of X2-Y1 and X2-Y2, where X2 consists of one or more of Ru, Mo, Nb and Hf, Y1 consists of one or both of Cr and Mn, and Y2 consists of Co,
    mixing the master alloy with a powder composed of the X2 to produce a mixed powder, and
    sintering the mixed powder to obtain a sputtering target material,
    wherein elements constituting the sputter target are selected among X2, Y1, and Y2, such that the sputtering target consists of an alloy of X2-Y1 or X2-Y2, and
    wherein a variation in an in-plane metal composition of Y1 or Y2 of the sputtering target is 30% or less.

2. The method of producing a sputtering target according to claim 1, wherein the mixing is performed so that a content of Y1 or Y2 of a composition constituting the master alloy falls within a range of 0.1 to 40.0 at %.

3. A sputtering target in which elements constituting the sputter target are selected among X2, Y1, and Y2, wherein X2 consists of one or more of Ru, Mo, Nb and Hf, Y1 consists of one or both of Cr and Mn, and Y2 consists of Co, and wherein the sputtering target consists of an alloy of X2-Y1 or X2-Y2, and wherein a variation in an in-plane metal composition of Y1 or Y2 of the sputtering target is 30% or less.

4. The sputtering target according to claim 3, wherein the variation in an in-plane metal composition of Y1 or Y2 of the sputtering target is 20% or less.

5. The sputtering target according to claim 3, wherein the variation in an in-plane metal composition of Y1 or Y2 of the sputtering target is 15% or less.

* * * * *